(12) United States Patent
Son et al.

(10) Patent No.: US 12,087,560 B2
(45) Date of Patent: Sep. 10, 2024

(54) APPARATUS AND METHOD FOR TREATING SUBSTRATE

(71) Applicant: SEMES CO., LTD., Cheonan-si (KR)

(72) Inventors: Dukhyun Son, Cheonan-si (KR); Byung Kyu Kim, Seoul (KR)

(73) Assignee: SEMES CO., LTD., Cheonan-si (KR)

( * ) Notice: Subject to any disclaimer, the term of this patent is extended or adjusted under 35 U.S.C. 154(b) by 614 days.

(21) Appl. No.: 17/216,972

(22) Filed: Mar. 30, 2021

(65) Prior Publication Data

US 2021/0217594 A1 Jul. 15, 2021

Related U.S. Application Data

(62) Division of application No. 16/793,028, filed on Feb. 18, 2020, now Pat. No. 11,295,936.

(30) Foreign Application Priority Data

Feb. 21, 2019 (KR) ........................ 10-2019-0020653

(51) Int. Cl.
*H01J 37/32* (2006.01)
*B25J 11/00* (2006.01)
(Continued)

(52) U.S. Cl.
CPC ....... *H01J 37/32743* (2013.01); *B25J 11/005* (2013.01); *H01J 37/32642* (2013.01);
(Continued)

(58) Field of Classification Search
None
See application file for complete search history.

(56) References Cited

U.S. PATENT DOCUMENTS 6,382,902 B1 5/2002 Sugimura
7,114,693 B1 10/2006 Olgado et al.
(Continued)

FOREIGN PATENT DOCUMENTS

CN 1188820 A 7/1998
CN 103811399 A 5/2014
(Continued)

OTHER PUBLICATIONS

Article—What is the RAYDENT treatment as found at raydent.co.jp/eng/syon_eng.html Jan. 7, 2003 (Year: 2003).*
(Continued)

*Primary Examiner* — Sylvia MacArthur
(74) *Attorney, Agent, or Firm* — Harness, Dickey & Pierce, P.L.C.

(57) ABSTRACT

The substrate treating apparatus includes a processing module and an index module on which a cassette having the substrate received therein is placed and that includes an index robot that transfers the substrate between the cassette and the processing module. The processing module includes a process chamber and a transfer chamber. The process chamber includes a support unit. The support unit includes a support on which the substrate is placed and a ring member that surrounds the substrate placed on the support and that is provided so as to be detachable from the support. The apparatus further includes a carrier storage unit that stores a carrier that is mounted on a hand of the main transfer robot or the index robot and on which the ring member is placed when the ring member is transferred by the main transfer robot or the index robot.

10 Claims, 7 Drawing Sheets

(51) Int. Cl.
  *H01L 21/3065* (2006.01)
  *H01L 21/67* (2006.01)
  *H01L 21/677* (2006.01)
  *H01L 21/687* (2006.01)

(52) U.S. Cl.
  CPC .... *H01L 21/3065* (2013.01); *H01L 21/67069* (2013.01); *H01L 21/67766* (2013.01); *H01L 21/67769* (2013.01); *H01L 21/67778* (2013.01); *H01L 21/68707* (2013.01)

(56) References Cited

U.S. PATENT DOCUMENTS

| | | | | |
|---|---|---|---|---|
| 8,110,044 | B2* | 2/2012 | Nozawa | H01L 21/67109 |
| | | | | 118/725 |
| 8,287,688 | B2* | 10/2012 | Wallace | H01L 21/67109 |
| | | | | 118/724 |
| 8,366,872 | B2* | 2/2013 | Tsutsumi | H01L 21/67745 |
| | | | | 216/87 |
| 9,829,802 | B2* | 11/2017 | Matsuhira | H01L 21/67742 |
| 10,825,705 | B2* | 11/2020 | Johnson | H01L 21/67092 |
| 2008/0216880 | A1* | 9/2008 | Shiomi | H01L 21/67781 |
| | | | | 134/133 |
| 2013/0193703 | A1 | 8/2013 | Ando et al. | |
| 2014/0190513 | A1* | 7/2014 | Lee | H01L 21/67383 |
| | | | | 414/217 |
| 2015/0010381 | A1 | 1/2015 | Cai | |
| 2015/0340209 | A1 | 11/2015 | Koltonski | |
| 2017/0117170 | A1 | 4/2017 | Wong et al. | |
| 2017/0372933 | A1* | 12/2017 | Kim | H01L 21/67748 |
| 2018/0019107 | A1 | 1/2018 | Ishizawa | |
| 2018/0166310 | A1* | 6/2018 | Onzuka | H01L 21/67754 |
| 2019/0122870 | A1 | 4/2019 | Ishizawa | |
| 2021/0217594 | A1* | 7/2021 | Son | H01L 21/67748 |

FOREIGN PATENT DOCUMENTS

| | | | |
|---|---|---|---|
| CN | 103972139 A | | 8/2014 |
| CN | 107346757 A | | 11/2017 |
| JP | 2007-048920 A | | 2/2007 |
| JP | 2007-158170 A | | 6/2007 |
| JP | 2008-258570 A | | 10/2008 |
| JP | 6278862 B2 | | 2/2018 |
| KR | 2009002709 A | * | 1/2009 ............ H01L 21/02 |
| KR | 10-0898637 B1 | | 5/2009 |
| KR | 10-2017-0054253 A | | 5/2017 |
| KR | 10-2018-0008290 A | | 1/2018 |
| KR | 10-2018-0021492 A | | 3/2018 |
| KR | 10-2005610 B1 | | 7/2019 |
| WO | WO-2016/201717 A1 | | 12/2016 |

OTHER PUBLICATIONS

Notice of Allowance of U.S. Appl. No. 16/793,028 dated Dec. 1, 2021.
Office Action for Korean Application No. 10-2019-0020653 dated Aug. 5, 2020.
Office Action for Chinese Application No. 202010103873.0 dated Jan. 4, 2023.
Office action dated May 27, 2021, issued in corresponding U.S. Appl. No. 16/793,028.

* cited by examiner

APPARATUS AND METHOD FOR TREATING SUBSTRATE

CROSS-REFERENCE TO RELATED APPLICATIONS

This is a divisional of U.S. application Ser. No. 16/793,028, filed Feb. 18, 2020, which claims priority to Korean Application No. 10-2019-0020653, filed on Feb. 21, 2019, the disclosures of each of which are hereby incorporated by reference in their entirety.

BACKGROUND

Embodiments of the inventive concept described herein relate to an apparatus and method for treating a substrate.

To manufacture semiconductor devices, desired patterns are formed on a substrate by performing various processes, such as photolithography, etching, ashing, ion implantation, thin-film deposition, cleaning, and the like, on the substrate. The substrate has to be transferred to sequentially perform the various processes. The substrate is transferred between units by a substrate transfer apparatus. The substrate transfer apparatus used in the semiconductor device manufacturing processes includes a plurality of multi-joint arms and finger parts, and the multi-joint arms and a hand (also referred to as an end effector) operate in conjunction with each other. In etching process equipment used for the etching process, among the aforementioned processes, internal parts have to be replaced in view of the amounts by which the parts are etched and a variation in the electric field inside. In the semiconductor manufacturing processes, technologies for replacing and maintaining not only a substrate but also other parts other than the substrate using a robot are required to improve productivity.

Among the technologies, a technology for replacing a focus ring using a robot is required. In general, a substrate is transferred by a method using vacuum clamping. However, in the case where a focus ring is transferred by the method using the vacuum clamping, the transfer of the focus ring is unstable because the focus ring has a large opening in the center thereof so that a contact area is narrow and the focus ring is not well attached.

Furthermore, the substrate and the focus ring have different diameters, and therefore vacuum holes for clamping the substrate and vacuum holes for clamping the focus ring have to be separately formed on a hand. Accordingly, the internal structure is complex.

SUMMARY

Embodiments of the inventive concept provide a substrate treating apparatus and method for stably transferring a focus ring using an existing hand.

Embodiments of the inventive concept provide a substrate treating apparatus and method for stably transferring a focus ring using a separate carrier.

The technical problems to be solved by the inventive concept are not limited to the aforementioned problems. Any other technical problems not mentioned herein will be clearly understood from the following description by those skilled in the art to which the inventive concept pertains.

According to an exemplary embodiment, disclosed is an apparatus for treating a substrate.

The substrate treating apparatus includes a processing module that treats the substrate and an index module on which a cassette having the substrate received therein is placed and that includes an index robot that transfers the substrate between the cassette and the processing module. The processing module includes a process chamber that treats the substrate using plasma and a transfer chamber having a main transfer robot installed therein, in which the main transfer robot transfers the substrate into the process chamber. The process chamber includes a housing having a processing space therein, a support unit that supports the substrate in the processing space, a gas supply unit that supplies a process gas into the processing space, and a plasma source that generates plasma from the process gas. The support unit includes a support on which the substrate is placed and a ring member that surrounds the substrate placed on the support and that is provided so as to be detachable from the support. The apparatus further includes a carrier storage unit that stores a carrier that is mounted on a hand of the main transfer robot or the index robot and on which the ring member is placed when the ring member is transferred by the main transfer robot or the index robot.

The carrier storage unit may be provided on the index module.

The index module may further include at least one load port on which the cassette is placed and a transfer frame in which the index robot that transfers the substrate between the cassette placed on the load port and the processing module is provided. The load port and the transfer frame may be arranged in a first direction, and the load port and the carrier storage unit may be arranged in a second direction perpendicular to the first direction when viewed from above.

According to another embodiment, the carrier storage unit may be provided in a position that is spaced apart from the processing module and the index module.

Each of the index robot or the main transfer robot may include a robot arm and a hand coupled to the robot arm, and the carrier stored in the carrier storage unit may include a body mounted on an upper surface of the hand of the index robot or an upper surface of the hand of the main transfer robot and an anti-slip member provided on the body.

An upper surface of the anti-slip member may be formed of a material having a higher coefficient of friction than an upper surface of the body.

A RAYDENT coating layer may be formed on the body.

The anti-slip member may include a plurality of anti-slip members, each of which has a ring shape.

The hand of the index robot or the hand of the main transfer robot may support the substrate and the carrier by vacuum clamping.

The carrier storage unit may store the carrier alone or the carrier having the ring member placed thereon.

According to an exemplary embodiment, disclosed is a method for treating a substrate.

The substrate treating method includes supporting the substrate using a support unit including a ring member that surrounds a periphery of the substrate in a processing space and performing predetermined processing on the substrate. The ring member is transferred by a transfer robot having a hand, and the ring member is supported by a carrier mounted on the hand when the ring member is transferred by the hand.

An anti-slip member may be mounted on a surface of the carrier on which the ring member is placed.

The anti-slip member may include a plurality of O-rings.

The carrier may be mounted on the hand by vacuum clamping.

The substrate may be directly supported on the hand when the substrate is transferred by the transfer robot.

A transfer speed of the hand when the focus ring is transferred may be lower than a transfer speed of the hand when the substrate is transferred.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
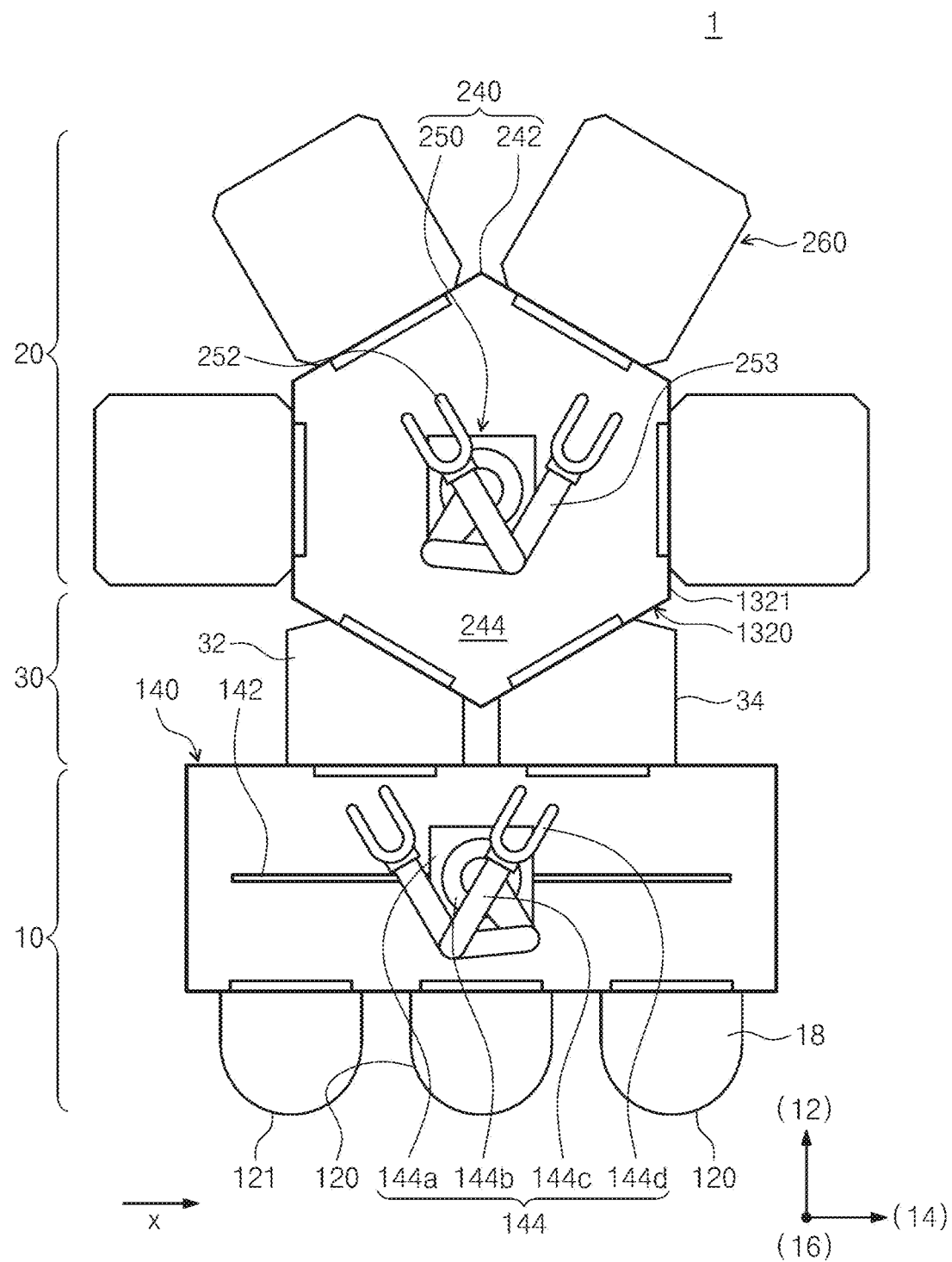
FIG. 1 is a view illustrating a substrate treating apparatus according to the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms such as first, second, and the like may be used to describe various components, but the components should not be limited by the terms. The terms may be used only for distinguishing one component from others. For example, without departing the scope of the inventive concept, a first component may be referred to as a second component, and similarly, the second component may also be referred to as the first component.

The terms of a singular form may include plural forms unless otherwise specified. Furthermore, in the drawings, the shapes and dimensions of components may be exaggerated for clarity of illustration.

A substrate in a circular shape having no space inside is able to be stably transferred by using a hand that supports the central portion of the circular substrate. However, a ring member in a ring shape having an empty space inside has a smaller contact area than the substrate, and therefore there is a difference in adhesive force between the ring member and the substrate. Furthermore, the ring member is not well attached and is unstable when transferred by using a hand. To address the above-mentioned problems, the inventive concept provides a method for transferring a ring member using a separate carrier having a size corresponding to the shape of the ring member, and a substrate treating apparatus. In addition, in consideration of a risk that the ring member slides and drops when only the carrier is used to transfer the ring member, an anti-slip member is attached to the upper surface of the carrier that corresponds to the ring member, thereby enabling the ring member to be more stably transferred.

Hereinafter, embodiments of the inventive concept will be described in detail with reference to the accompanying drawings.

FIG. 1 is a plan view illustrating a substrate treating apparatus according to an embodiment of the inventive concept.

Referring to FIG. 1, the substrate treating apparatus 1 has an index module 10, a load-lock module 30, and a process module 20. The index module 10 has load ports 120 and a transfer frame 140. The load ports 120, the transfer frame 140, and the process module 20 are sequentially arranged in a row. Hereinafter, the direction in which the load ports 120, the transfer frame 140, the load-lock module 30, and the process module 20 are arranged is referred to as a first direction 12, a direction perpendicular to the first direction 12 when viewed from above is referred to as a second direction 14, and a direction perpendicular to the plane including the first direction 12 and the second direction 14 is referred to as a third direction 16.

In the inventive concept, the load-lock module 30 and the process module 20 are collectively referred to as the processing module.

Cassettes 18, each of which has a plurality of substrates W received therein, are placed on the load ports 120. The load ports 120 are arranged in a row along the second direction 14. FIG. 1 illustrates an example that the index module 10 includes two load ports 120 and one carrier storage unit 121. However, the number of load ports 120 may be increased or decreased depending on conditions such as the process efficiency and footprint of the process module 20. Each of the cassettes 18 has a plurality of slots (not illustrated) that are formed therein to support the edges of the substrates W. The plurality of slots are arranged in the third direction 16, and the substrates W are stacked one above another with a spacing gap therebetween in the cassette 18 along the third direction 16. A front opening unified pod (FOUP) may be used as the cassette 18.

The index module 10 may include the carrier storage unit 121. The carrier storage unit 121 is a unit for storing a carrier on which a ring member is placed when the ring member is transferred into a chamber using a hand. The exterior of the carrier storage unit 121 may be similar to the exterior of the cassette 18. Also, the interior of the carrier storage unit 121 may be similar to the interior of the cassette 18.

In the load ports 120 on which the cassettes 18 are placed and the transfer frame 140 including an index robot for transferring the substrates W between the cassettes 18 placed on the load ports 120 and the processing module, the load ports 120 and the transfer frame 140 may be arranged in the first direction, and the load ports 120 and the carrier storage unit 121 may be arranged in the same direction as the first direction when viewed from above.

As illustrated in FIG. 1, the carrier storage unit 121 and the load ports 120 are arranged side by side. Although the carrier storage unit 121 is illustrated as being disposed on one side of the load ports 120, the carrier storage unit 121 may be disposed between the load ports 120. In other words, the carrier storage unit 121 may be disposed in every place where the load ports 120 are able to be disposed.

In another embodiment, the carrier storage unit 121 may be arranged in the second direction perpendicular to the first direction when viewed from above. The carrier storage unit 121 may be disposed on a side of the transfer frame 140 on which the load ports 120 are not disposed. According to another embodiment, the carrier storage unit 121 may be located in a position spaced apart from the processing module 20 and 30 and the index module 10. When the carrier storage unit 121 is located in a position spaced apart from the processing module 20 and 30 and the index module 10, the carrier storage unit 121 may be transferred into the index module 10 by using a separate transfer apparatus (not illustrated).

Additional description of the carrier storage unit 121 will be given below with reference to FIG. 7.

The transfer frame 140 transfers the substrates W between the cassettes 18 placed on the load ports 120 and the load-lock module 30. An index rail 142 and an index robot 144 are provided in the transfer frame 140. The index rail 142 is arranged such that the lengthwise direction thereof is parallel to the second direction 14. The index robot 144 is installed on the index rail 142 and rectilinearly moves along the index rail 142 in the second direction 14. The index robot 144 has a base 144a, a body 144b, index arms 144c, and hands 144d. The base 144a is installed so as to be movable along the index rail 142. The body 144b is coupled to the base 144a. The body 144b is movable on the base 144a along the third direction 16. Furthermore, the body 144b is rotatable on the base 144a. The index arms 144c are coupled to the body 144b and are movable forward and backward relative to the body 144b. The index arms 144c may individually operate. The index arms 144c are stacked one above another with a spacing gap therebetween along the third direction 16. Some of the index arms 144c may be used to transfer the substrates W from the process module 20 to the cassettes 18, and the other index arms 144c may be used to transfer the substrates W from the cassettes 18 to the process module 20. Accordingly, particles generated from the substrates W that are to be treated may be prevented from adhering to the treated substrates W in the process in which the index robot 144 transfers the substrates W between the cassettes 18 and the process module 20.

The load-lock module 30 is disposed between the transfer frame 140 and a transfer unit 240. The load-lock module 30 replaces the atmospheric atmosphere of the index module 10 with the vacuum atmosphere of the process module 20 for a substrate W to be transferred to the process module 20, or replaces the vacuum atmosphere of the process module 20 with the atmospheric atmosphere of the index module 10 for a substrate W to be transferred to the index module 10. The load-lock module 30 provides a space in which the substrate W stay before transferred between the transfer unit 240 and the transfer frame 140. The load-lock module 30 includes a load-lock chamber 32 and an unload-lock chamber 34.

The load-lock chamber 32 provides a space in which a substrate W to be transferred from the index module 10 to the process module 20 temporarily stays. The load-lock chamber 32 maintains an atmospheric atmosphere in a standby state and is closed to the process module 20, but open to the index module 10. When the substrate W is placed in the load-lock chamber 32, the inner space of the load-lock chamber 32 is sealed from the index module 10 and the process module 20. Thereafter, the atmospheric atmosphere in the load-lock chamber 32 is replaced with a vacuum atmosphere, and the load-lock chamber 32 is open to the process module 20 in the state of being closed to the index module 10.

The unload-lock chamber 34 provides a space in which a substrate W to be transferred from the process module 20 to the index module 10 temporarily stays. The unload-lock chamber 34 maintains a vacuum atmosphere in a standby state and is closed to the index module 10, but open to the process module 20. When the substrate W is placed in the unload-lock chamber 34, the inner space of the unload-lock chamber 34 is sealed from the index module 10 and the process module 20. Thereafter, the vacuum atmosphere in the unload-lock chamber 34 is replaced with an atmospheric atmosphere, and the unload-lock chamber 34 is open to the index module 10 in the state of being closed to the process module 20.

The process module 20 includes the transfer unit 240 and a plurality of process chambers 260.

The transfer unit 240 transfers a substrate W between the load-lock chamber 32, the unload-lock chamber 34, and the plurality of process chambers 260. The transfer unit 240 includes a transfer chamber 242 and a main transfer robot 250. The transfer chamber 242 may have a hexagonal shape. Alternatively, the transfer chamber 242 may have a rectangular or pentagonal shape. The load-lock chamber 32, the unload-lock chamber 34, and the plurality of process chambers 260 are located around the transfer chamber 242. A transfer space 244 for transferring the substrate W is provided in the transfer chamber 242.

The transfer robot 250 transfers the substrate W in the transfer space 244. The transfer robot 250 may be located at the center of the transfer chamber 242. The transfer robot 250 may have a plurality of hands 252 that are movable in the horizontal and vertical directions and movable forward or backward or rotatable on the horizontal plane. The hands 252 are operable independently, and substrates W may be horizontally placed on the hands 252.

The transfer unit 240 may include the hands 252 on each of which a substrate is placed and robot arms 253. A robot body (not illustrated) has a drive means such as a stepping motor inside and controls operations of the robot arms 253. The robot arms 253 may receive power from the robot body (not illustrated) and may perform a folding or unfolding operation to transfer the substrates. Furthermore, the robot arms 253 may move upward or downward in the vertical direction. The hands 252 may be provided in various shapes.

In an embodiment, to facilitate the transfer of a substrate and other member(s) into or out of other component(s), the hands 252 may be provided in a "Y" shape connected to tip ends of the robot arms 253. Although it has been exemplified in this embodiment that the hands 252 have a "Y" shape, the hands 252 may be provided in various shapes such as an "I" shape.

The process chambers 260 perform a process of treating a substrate using plasma. According to an embodiment, the substrate treating process may be an etching process. Alternatively, the process performed in the process chambers 260 may be a process of treating a substrate using gas other than plasma.

Figure 2:
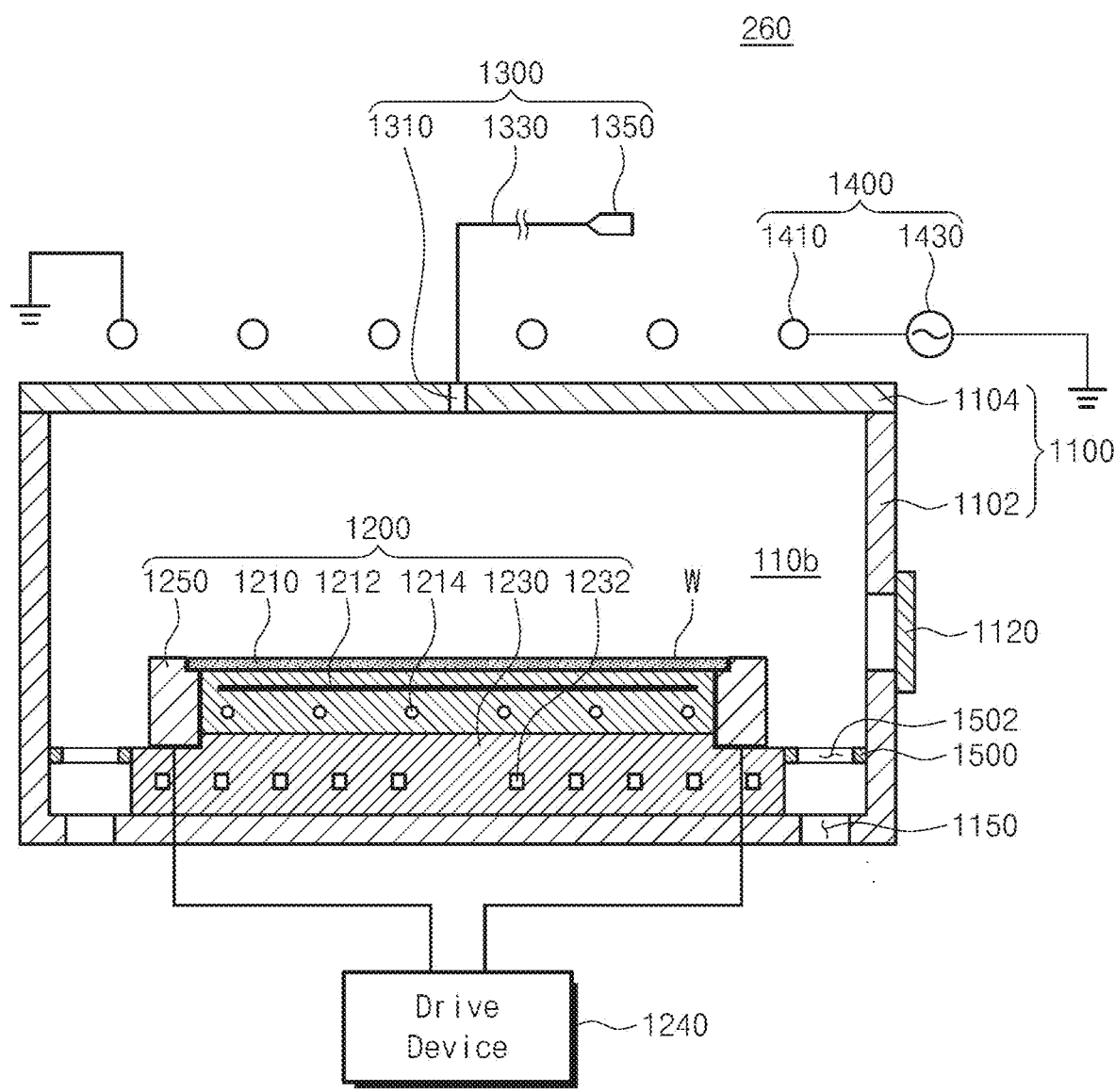
FIG. 2 is a view illustrating a process chamber according to the inventive concept.

FIG. 2 is a sectional view illustrating the process chamber 260 of FIG. 1. Referring to FIG. 2, the process chamber 260 includes a housing 1100, a substrate support unit 1200, a gas supply unit 1300, a plasma source 1400, and an exhaust baffle 1500.

The housing 1100 has a processing space 1106 in which a substrate W is treated. The housing 1100 has a cylindrical shape. The housing 1100 is formed of a metallic material. For example, the housing 1100 may be formed of aluminum. The housing 1100 has an opening formed in a sidewall thereof. The opening functions as an entrance through which the substrate W is placed in or extracted from the housing 1100. The opening is opened or closed by a door 1120. The housing 1100 has a lower hole 1150 formed in the bottom thereof. A pressure-reducing member (not illustrated) is connected to the lower hole 1150. The processing space 1106 of the housing 1100 may be evacuated by the pressure-reducing member, and a pressure-reduced atmosphere may be formed in the processing space 1106.

The substrate support unit 1200 supports the substrate W in the processing space 1106. The substrate support unit 1200 may be an electrostatic chuck 1200 that supports the substrate W using an electrostatic force. Alternatively, the substrate support unit 1200 may support the substrate W in various manners such as mechanical clamping.

The electrostatic chuck 1200 includes a dielectric plate 1210, a base 1230, and a focus ring 1250. The dielectric plate 1210 contains a dielectric substance. The substrate W is directly placed on an upper surface of the dielectric plate 1210. The dielectric plate 1210 has a circular plate shape. The dielectric plate 1210 may have a smaller radius than the substrate W. An inner electrode 1212 is installed in the dielectric plate 1210. A power supply (not illustrated) is connected to the inner electrode 1212, and electric power is applied from the power supply (not illustrated) to the inner electrode 1212. The inner electrode 1212 provides an electrostatic force from the applied power (not illustrated) such that the substrate W is clamped to the dielectric plate 1210. A heater 1214 for heating the substrate W is installed in the dielectric plate 1210. The heater 1214 may be located under the inner electrode 1212. The heater 1214 may be implemented with a coil in a spiral shape.

The base 1230 supports the dielectric plate 1210. The base 1230 is located under the dielectric plate 1210 and is fixedly coupled with the dielectric plate 1210. An upper surface of the base 1230 has a stepped shape such that the central region is located in a higher position than the edge region. The central region of the upper surface of the base 1230 has an area corresponding to that of the bottom surface of the dielectric plate 1210. A cooling fluid channel 1232 is formed in the base 1230. The cooling fluid channel 1232 serves as a passage through which a cooling fluid circulates. The cooling fluid channel 1232 may be provided in a spiral shape in the base 1230. The base 1230 is connected with an RF power supply 1234 located outside. The RF power supply 1234 applies power to the base 1230. The power applied to the base 1230 guides plasma generated in the housing 1100 toward the base 1230. The base 1230 may be formed of a metallic material. When the substrate W is treated in the process chamber 260, one or more focus rings 1250 are provided around the substrate W.

The focus ring 1250 concentrates plasma onto the substrate W. The focus ring 1250 has a ring shape and is disposed around the dielectric plate 1210. An upper surface of the focus ring 1250 may have a stepped shape such that the inner portion adjacent to the dielectric plate 1210 is located in a lower position than the outer portion. The inner portion of the upper surface of the focus ring 1250 may be located at the same height as the central region of the upper surface of the dielectric plate 1210. The inner portion of the upper surface of the focus ring 1250 supports the edge region of the substrate W that is located outside the dielectric plate 1210. The focus ring 1250 expands an electric-field formation area to locate the substrate W at the center of the area in which plasma is formed.

A drive device 1240 for driving the focus ring 1250 may be connected to the focus ring 1250. The drive device 1240 may operate to move the focus ring 1250 up and down when the focus ring 1250 needs to be replaced. The drive device 1240 may include a pin structure (not illustrated) that moves the focus ring 1250 up and down. When the focus ring 1250 needs to be replaced, the focus ring 1250 is moved upward by the pin structure (not illustrated) that is included in the drive device 1240. When the focus ring 1250 is moved upward, the hand 144d or 252 may be inserted below the focus ring 1250 to receive the focus ring 1250 from the pin structure (not illustrated).

The gas supply unit 1300 supplies a process gas onto the substrate W supported on the substrate support unit 1200. The gas supply unit 1300 includes a gas reservoir 1350, a gas supply line 1330, and a gas intake port 1310. The gas supply line 1330 connects the gas reservoir 1350 and the gas intake port 1310. The process gas stored in the gas reservoir 1350 is supplied to the gas intake port 1310 through the gas supply line 1330. The gas intake port 1310 is installed in an upper wall 1104 of the housing 1100. The gas intake port 1310 is located to face the substrate support unit 1200. According to an embodiment, the gas intake port 1310 may be installed in the center of the upper wall 1104 of the housing 1100. A valve may be installed in the gas supply line 1330 to open or close the inner passage of the gas supply line 1330 or to adjust the flow rate of gas flowing through the inner passage of the gas supply line 1330. For example, the process gas may be an etching gas.

The plasma source 1400 excites the process gas in the housing 1100 into a plasma state. An inductively coupled plasma (ICP) source may be used as the plasma source 1400. The plasma source 1400 includes an antenna 1410 and an external power supply 1430. The antenna 1410 is disposed over the housing 1100. The antenna 1410 is provided in a spiral shape wound a plurality of times and is connected with the external power supply 1430. The antenna 1410 receives power from the external power supply 1430. The antenna 1410 to which the power is applied forms a discharge space in the interior space of the housing 1100. The process gas staying in the discharge space may be excited into a plasma state.

The exhaust baffle 1500 uniformly releases plasma from the processing space 1106 by region. The exhaust baffle 1500 has an annular ring shape. In the processing space 1106, the exhaust baffle 1500 is located between an inner wall of the housing 1100 and the substrate support unit 1200. The exhaust baffle 1500 has a plurality of exhaust holes 1502 formed therein. The exhaust holes 1502 are directed in the vertical direction. The exhaust holes 1502 extend from the top of the exhaust baffle 1500 to the bottom thereof. The exhaust holes 1502 are spaced apart from each other along the circumferential direction of the exhaust baffle 1500. The exhaust holes 1502 have a slit shape and have a lengthwise direction directed in the radial direction.

According to an embodiment, when the index robot 144 or the main transfer robot 250 transfers the focus ring 1250, both the robots may transfer the focus ring 1250 using a carrier 1600. However, according to another embodiment, the index robot 144 may use the carrier 1600 when transferring the focus ring 1250, and the main transfer robot 250 may use no carrier when transferring the focus ring 1250. In the corresponding embodiment, the robot arm 253 of the main transfer robot 250 may be remodeled to transfer a ring member and a substrate, and the main transfer robot 250 may transfer the ring member placed on a pad of the robot arm 253 thereof without a carrier. According to the corresponding embodiment, the carrier 1600 may be used to transfer the ring member from the carrier storage unit 121 to the load-lock module 30, and no carrier may be used in a process of transferring the ring member from the load-lock module 30 to the process chamber 260.

Hereinafter, for convenience of description, it is assumed that the index robot 144 transfers the focus ring 1250. However, this is for convenience of description, and the corresponding description may be applied to the main transfer robot 250 within a corresponding range and may be applied even when a ring member other than the focus ring 1250 is transferred.

Figure 3:
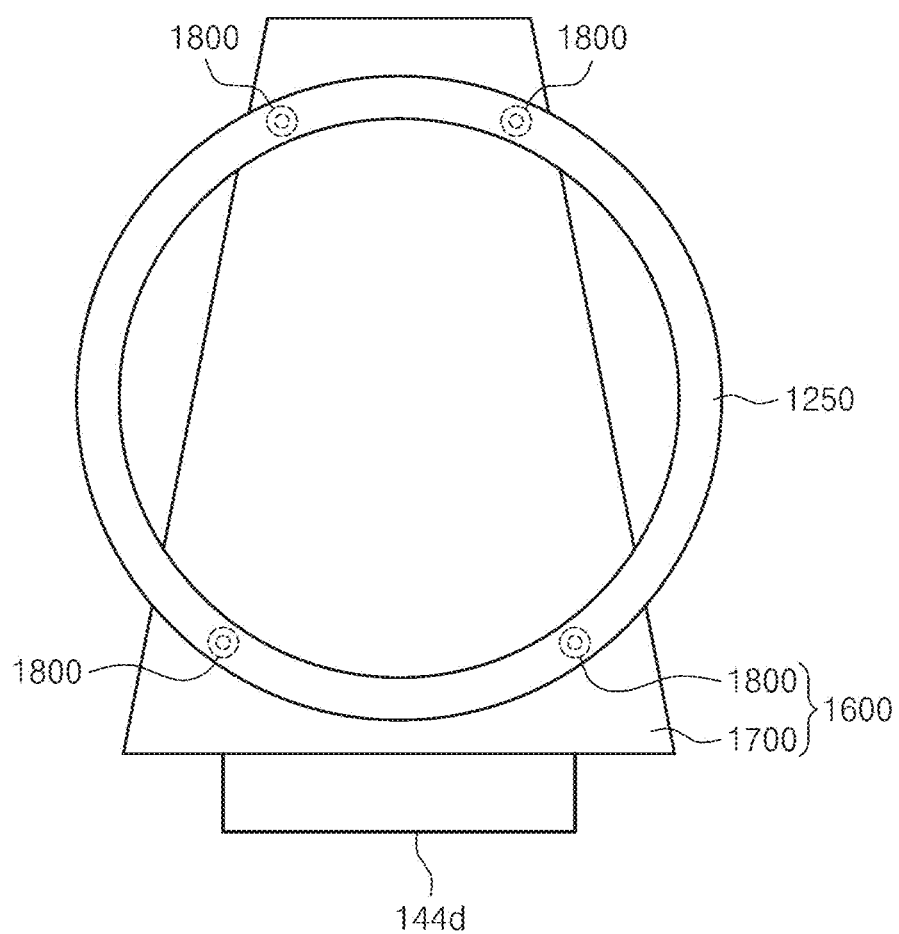
FIG. 3 is a top view of a hand when a ring member is transferred according to the inventive concept.
Figure 4:
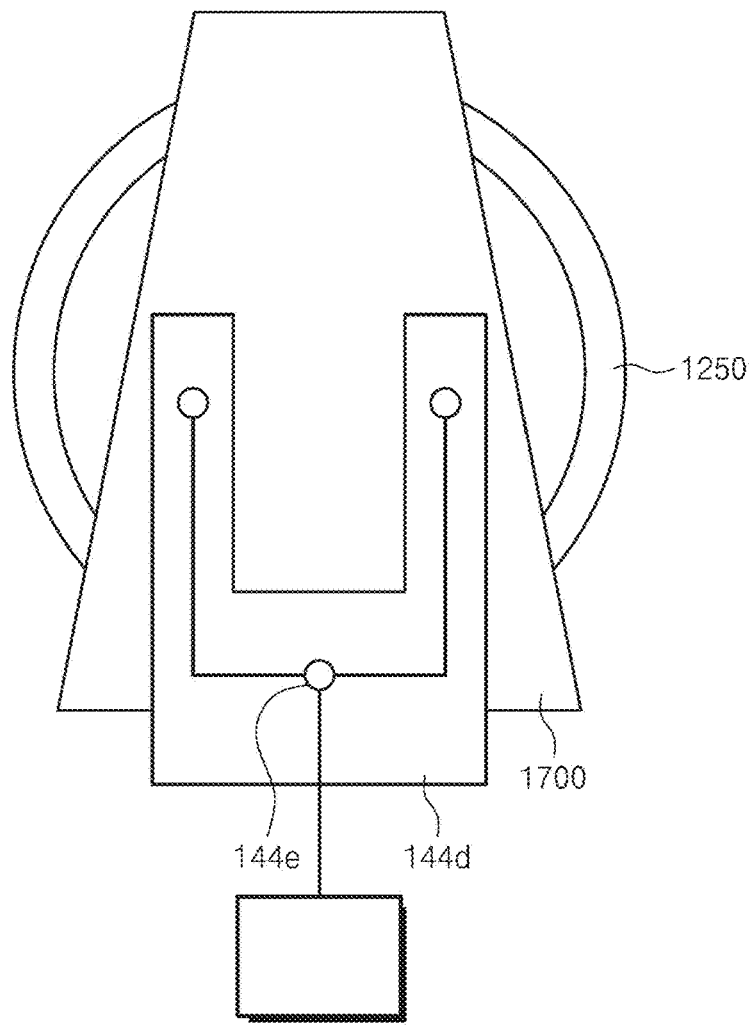
FIG. 4 is a bottom view of the hand when the ring member is transferred according to the inventive concept.
Figure 5:
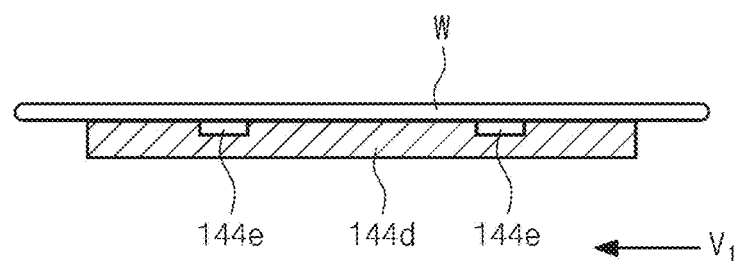
FIG. 5 is a side view of the hand when the ring member is transferred according to the inventive concept.

FIG. 3 is a top view of a structure in which a hand, a focus ring, and a carrier are coupled according to the inventive concept. FIG. 4 is a bottom view of the structure in which the hand, the focus ring, and the carrier are coupled according to the inventive concept. FIG. 5 is a side view of the structure in which the hand, the focus ring, and the carrier are coupled according to the inventive concept.

The coupling structure of the hand 144*d*, the focus ring 1250, and the carrier 1600 at the time of transfer will be described below with reference to the top view, the bottom view, and the side view illustrated in FIGS. 3 to 5.

The carrier 1600 according to the inventive concept may include a body 1700 mounted on the upper surface of the hand 144*d* or 252 of the index robot 144 or the main transfer robot 250 and an anti-slip member 1800 provided on the upper surface of the body 1700.

The body 1700 of the carrier 1600 may serve as a support to prevent a vacuum leak when the focus ring 1250 is transferred. The anti-slip member 1800 provided on the upper surface of the body 1700 of the carrier 1600 may minimize a risk that the focus ring 1250 slides when transferred.

A RAYDENT coating layer for preventing electrification may be formed on the body 1700 of the carrier 1600. The RAYDENT coating layer formed on the body 1700 of the carrier 1600 performs an antistatic function. The body 1700 of the carrier 1600 may have a suitable thickness to support the weight of the focus ring 1250. The body 1700 of the carrier 1600 may have a fan shape with a blunt end. As illustrated in FIG. 3, the body 1700 having a fan shape with a blunt end has an effect of corresponding to the outer diameter of the focus ring 1250. However, the shape of the body 1700 is not limited thereto. No special limitation applies to the shape of the body 1700 as long as the body 1700 has a minimal support area to stably support the focus ring 1250.

The anti-slip member 1800 of the carrier 1600 may be provided on the upper surface of the body 1700. The anti-slip member 1800 of the carrier 1600 makes direct contact with the focus ring 1250 without making direct contact with the hand 144*d*. The upper surface of the anti-slip member 1800 may be formed of a material having a higher coefficient of friction than the upper surface of the body 1700. The focus ring 1250 may be stably transferred without sliding by manufacturing the upper surface of the anti-slip member 1800 and the upper surface of the body 1700 with different materials.

A plurality of anti-slip members 1800 may be provided. The plurality of anti-slip members 1800 may have a ring shape. The plurality of anti-slip members 1800 may be a plurality of O-rings.

According to the coupling structure of FIGS. 3 to 5, the hand 144*d* may be located in the lowermost position, the body 1700 of the carrier 1600 may be located on the upper surface of the hand 144*d*, and the anti-slip members 1800 may be attached to the upper surface of the body 1700. The focus ring 1250 may be disposed in a position corresponding to the plurality of anti-slip members 1800.

According to an embodiment, the plurality of anti-slip members 1800 may be combined to derive a shape corresponding to the focus ring 1250 to be transferred. The plurality of anti-slip members 1800 may be provided in a position corresponding to the focus ring 1250 to be transferred.

According to an embodiment of the inventive concept, the upper surfaces of the anti-slip members 1800 attached to the upper surface of the body 1700 of the carrier 1600 make contact with the lower surface of the focus ring 1250, and thus the focus ring 1250 may be stably transferred.

Referring to FIGS. 3 to 5, the hand 144*d* has vacuum holes 144*e* formed thereon. As illustrated in FIGS. 3 to 5, the hand 144*d* clamps and supports the substrate W or the carrier 1600 by vacuum pressure in the vacuum holes 144*e*. However, in addition to the vacuum clamping, various methods of supporting the substrate W or the carrier 1600 using the hand 144*d* in terms of technology of a person skilled in the art may be used.

Figure 6:
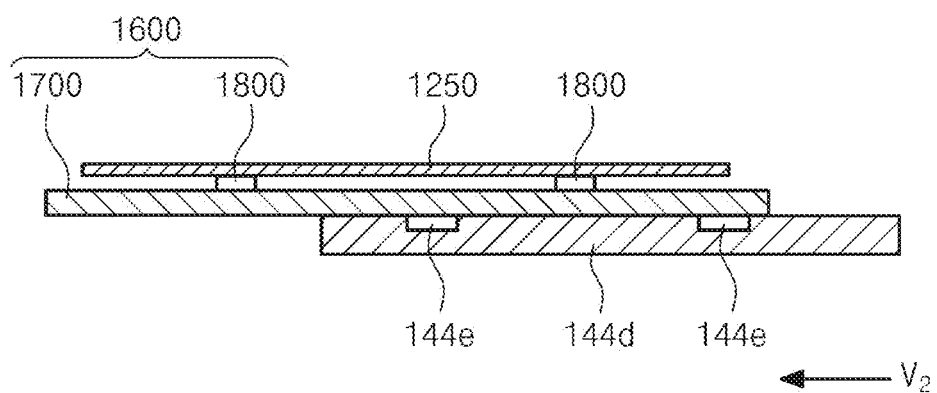
FIG. 6 is a side view of the hand when a substrate is transferred according to the inventive concept.

FIG. 6 is a side view of the hand when a substrate is transferred according to the inventive concept. Referring to FIG. 6, the substrate W is transferred in the state of being clamped by vacuum pressure in the vacuum holes 144*e* of the hand 144*d*. However, the substrate W is able to be transferred by using various methods in addition to the vacuum clamping.

The substrate W is transferred at a speed of V1 as illustrated in FIG. 6. The focus ring 1250 is transferred at a speed of V2 as illustrated in FIG. 5. The transfer speed V1 of the substrate W may be higher than the transfer speed V2 of the focus ring 1250. Because the substrate W is stably transferred, there is a low risk of an error even though the substrate W is transferred at high speed. However, because the focus ring 1250 has a larger diameter than the substrate W and is transferred by the separate carrier 1600 and the anti-slip members 180, there is a risk that the focus ring 1250 drops when being transferred at the same speed as the transfer speed of the substrate W. Accordingly, the focus ring 1250 may be transferred at the speed of V2 that is lower than the transfer speed V1 of the substrate W.

Figure 7:
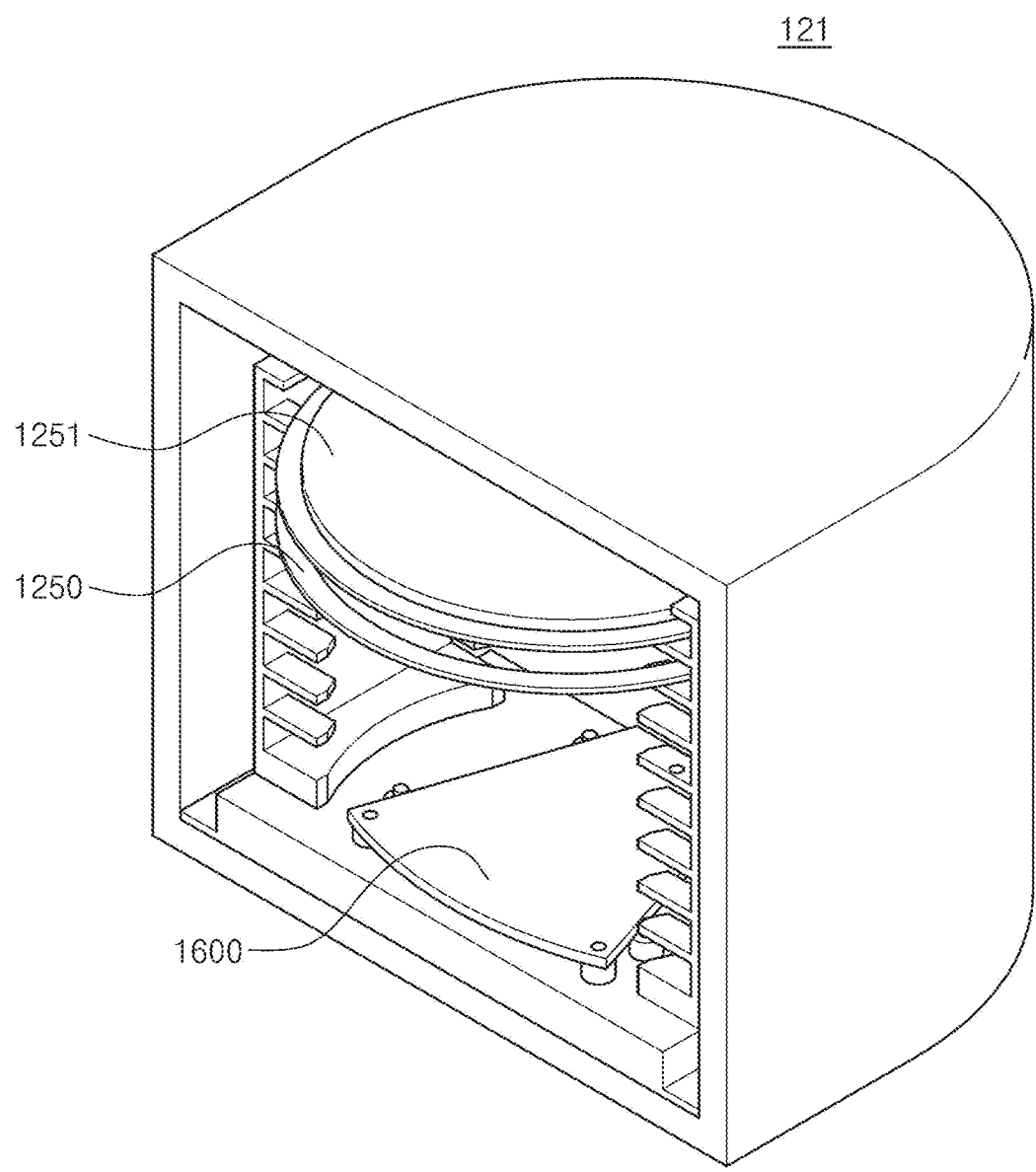
FIG. 7 is a view illustrating a carrier storage unit according to the inventive concept.

FIG. 7 is a view illustrating the carrier storage unit 121.

Referring to FIG. 7, a vision wafer 1251 may be loaded in the uppermost slot in the carrier storage unit 121. The vision wafer 1251 may have a circular shape with a diameter of 315 mm. The vision wafer 1251 may be equipped with a camera. Ring members may be loaded in intermediate slots in the carrier storage unit 121. Although FIG. 7 illustrates an example that only one ring member 1250 is loaded in the carrier storage unit 121, this is merely illustrative, and the carrier storage unit 121 may be full of ring members.

The carrier 1600 that is used to transfer the ring member 1250 may be stored in the carrier storage unit 121. Depending on the shape, the carrier 1600 may be located on a slot in which the ring member 1250 is stored. Alternatively, the carrier 1600 may be located in a lower layer of the carrier storage unit 121. The carrier 1600 may be stored alone in the carrier storage unit 121. Alternatively, a carrier having a ring member attached thereto may be stored in the carrier storage unit 121.

In an embodiment of the inventive concept, likewise to the carrier storage unit 121, a FOUP for storing only ring members may be separately manufactured and used. In the case where the carrier storage unit 121 is located on the index module 10 as described above, the carrier storage unit 121 is likely to be transferred by an OHT. However, the carrier storage unit 121 may not be selected as a target to be transferred, by performing a communication change in equipment such that the carrier storage unit 121 is not transferred. Additionally, the text "HMER Ring FOUP" may be engraved on the exterior of the carrier storage unit 121 to prevent a risk of an error. The carrier storage unit 121 may be separately manufactured to store the ring member 1250 and the carrier 1600. The carrier storage unit 121 may be provided in a sealed structure.

Figure 8:
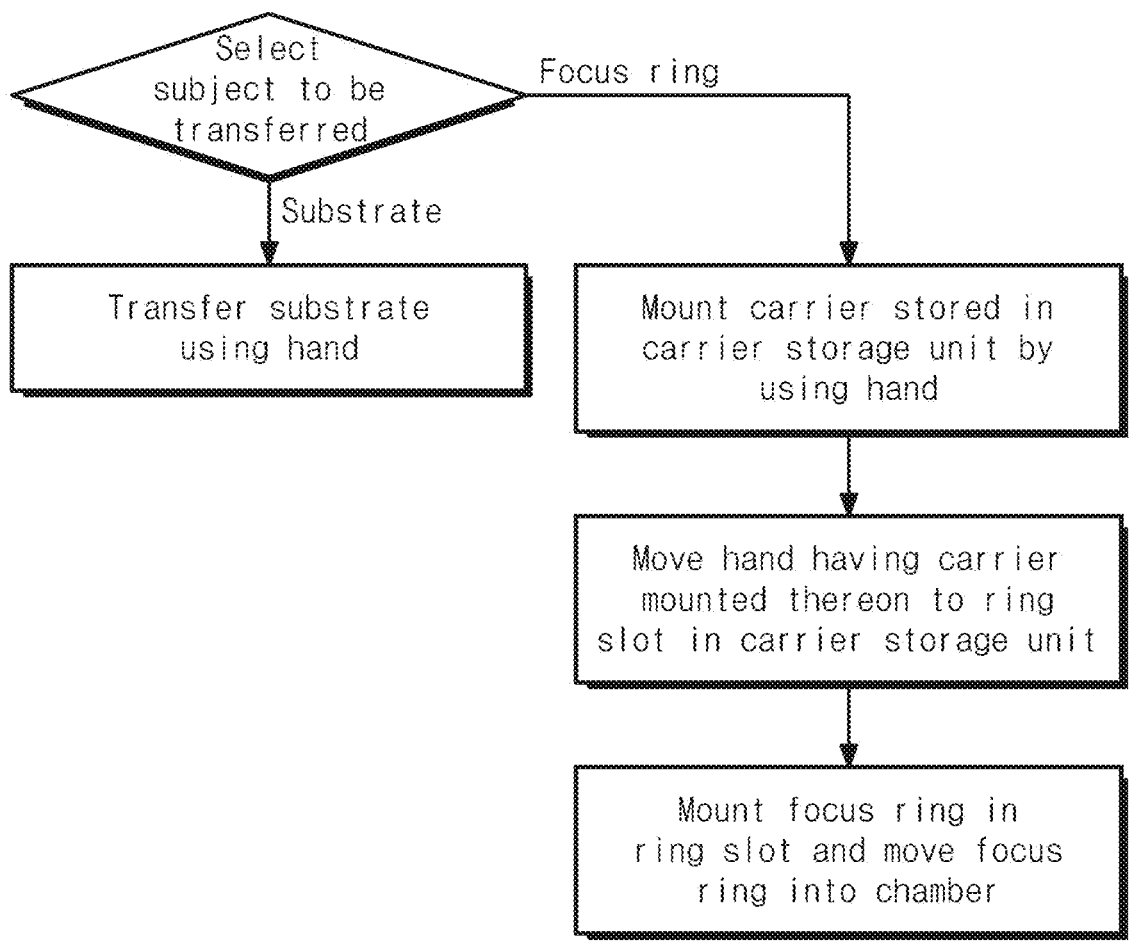
FIG. 8 is a flowchart illustrating a transfer method according to the inventive concept.

FIG. 8 is a view illustrating a substrate treating method according to the inventive concept.

Referring to FIG. 8, in the substrate treating method according to the inventive concept, a subject to be transferred is determined first.

In the case where the subject to be transferred is a substrate, the substrate is transferred in the state of being directly supported on a hand. At this time, the substrate may be fixed by a mechanical method using a clamp or a method using vacuum clamping.

In the case where the subject to be transferred is a focus ring, a carrier stored in the carrier storage unit 121 is mounted on the hand. The carrier may be located in the lowermost layer in the carrier storage unit 121. Ring members, in addition to the carrier, may be included in the carrier storage unit 121. The carrier storage unit 121 may be a type of FOUP. In the carrier storage unit 121, the carrier is mounted on the upper surface of the hand. At this time, the carrier may be mounted on the hand by vacuum clamping. Without being limited thereto, however, the carrier may be fixed to the hand by a different method. Thereafter, the hand having the carrier mounted thereon moves to a ring slot in the carrier storage unit 121. At this time, the hand may move in the third direction 16. In the case where there is no ring member in the carrier storage unit 121, the hand may move to a different ring storage slot or a different carrier storage unit. Thereafter, a ring member to be transferred is mounted on the upper surface of the carrier. At this time, the anti-slip members 1800 may be installed between the ring member and the carrier. The anti-slip members 1800 may be O-rings. That is, by installing the anti-slip members 1800, the ring member may be prevented from being shaken when transferred, and relatively stable transfer of the ring member may be performed.

At this time, there is a difference between the transfer speed of the substrate and the transfer speed of the focus ring. In the case of the substrate, there is no risk of a vacuum leak, and therefore there is no problem even though a robot rapidly moves. However, in the case of the method of transferring the focus ring according to the inventive concept, the focus ring is mounted on the O-ring on the upper surface of the carrier after the carrier is mounted on the hand, and therefore there is a risk that the mounted focus ring slides when the robot rapidly moves. Accordingly, the focus ring is transferred at a lower speed than the transfer speed of the substrate.

According to the embodiments of the inventive concept, the substrate treating apparatus and method has an effect of stably transferring a focus ring using an existing hand.

Furthermore, the substrate treating apparatus and method has an effect of stably transferring a focus ring using a separate carrier.

In addition, the substrate treating apparatus and method have an effect of minimizing sliding of a focus ring when the focus ring is transferred, by mounting a structure of an O-ring type on a separate carrier.

Effects of the inventive concept are not limited to the above-described effects. Any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. The drawings provided in the inventive concept are only drawings of the optimal embodiments of the inventive concept. The scope of the inventive concept should be determined by the technical idea of the claims, and it should be understood that the scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    a processing module configured to treat the substrate; and
    an index module on which a cassette having the substrate received therein is placed, the index module including an index robot configured to transfer the substrate between the cassette and the processing module,
    wherein the processing module includes,
    a process chamber configured to treat the substrate using plasma, and
    a transfer chamber having a main transfer robot installed therein, the main transfer robot being configured to transfer the substrate into the process chamber,
    wherein the process chamber includes,
        a housing having a processing space therein,
        a support unit configured to support the substrate in the processing space,
        a gas supply configured to supply a process gas into the processing space, and
        a plasma source configured to generate plasma from the process gas, wherein the support unit includes,
        a support configured to support the substrate to be placed thereon, and
        a ring member configured to surround the substrate placed on the support and to be detachable from the support, and
    wherein the apparatus further comprises a carrier storage configured to store a carrier including a body and an anti-slip member on the body, the anti-slip member configured to make direct contact with the ring member to be placed thereon, and
    the main transfer robot or the index robot comprises a hand including vacuum holes and configured to mount the body thereon, the hand configured to clamp and support the substrate or the body by vacuum pressure in the vacuum holes.

2. The apparatus of claim 1, wherein the carrier storage is provided on the index module.

3. The apparatus of claim 2, wherein
the index module further includes,
at least one load port on which the cassette is to be placed, and
a transfer frame in which the index robot configured to transfer the substrate between the cassette placed on the load port and the processing module is provided,
the load port and the transfer frame are arranged in a first direction, and
the load port and the carrier storage are arranged in a second direction perpendicular to the first direction when viewed from above.

4. The apparatus of claim 2, wherein each of the index robot or the main transfer robot includes,
a robot arm, and
the hand coupled to the robot arm.

5. The apparatus of claim 4, wherein an upper surface of the anti-slip member includes a material having a higher coefficient of friction than an upper surface of the body.

6. The apparatus of claim 4, further comprising:
A RAYDENT® coating layer on the body.

7. The apparatus of claim 4, wherein the anti-slip member includes a plurality of anti-slip members, each of which has a ring shape.

8. The apparatus of claim 4, wherein the carrier storage is configured to store the carrier, the substrate, and the ring member.

9. The apparatus of claim 1, wherein the carrier storage is spaced apart from the processing module and the index module.

10. The apparatus of claim 1, wherein the body included in the carrier has a fan shape with a blunt end.

* * * * *